(12) United States Patent
Thind (10) Patent No.: US 8,768,282 B2
(45) Date of Patent: Jul. 1, 2014

(54) APPARATUS GENERATING SUBCARRIER FOR TRANSMISSION BETWEEN ULTRA-HIGH FREQUENCY CHANNELS AND METHOD GENERATING OF THE SAME

(71) Applicant: Samsung Electronics Co., Ltd., Suwon-si (KR)

(72) Inventor: Surinder Singh Thind, Kent (GB)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/644,740

(22) Filed: Oct. 4, 2012

(65) Prior Publication Data

US 2013/0084822 A1 Apr. 4, 2013

Related U.S. Application Data

(60) Provisional application No. 61/542,964, filed on Oct. 4, 2011.

(30) Foreign Application Priority Data

Jan. 6, 2012 (GB) .................................. 1200195.4

(51) Int. Cl.
H04B 1/26 (2006.01)
(52) U.S. Cl.
USPC ........... 455/326; 455/314; 455/116; 455/126; 455/70; 455/313
(58) Field of Classification Search
CPC .................................. H04B 1/26; H04D 7/163
USPC .................... 455/326, 314, 116, 126, 70, 313; 331/60
See application file for complete search history.

(56) References Cited

U.S. PATENT DOCUMENTS

| | | | |
|---|---|---|---|
| 6,049,707 A * | 4/2000 | Buer et al. | 455/314 |
| 2005/0266806 A1 | 12/2005 | Soe et al. | |
| 2009/0286490 A1 | 11/2009 | Chung | |
| 2010/0283550 A1 * | 11/2010 | Kim et al. | 331/60 |

FOREIGN PATENT DOCUMENTS

| | | |
|---|---|---|
| GB | 1000024 | 8/1965 |
| WO | 2006051507 A1 | 5/2006 |

OTHER PUBLICATIONS

Communication dated May 15, 2013, issued by the European Patent Office in counterpart European Patent Application No. 12186171.0.

(Continued)

*Primary Examiner* — Sanh Phu
(74) *Attorney, Agent, or Firm* — Sughrue Mion, PLLC (57) ABSTRACT

Apparatus for generating a plurality of radio-frequency RF subcarrier signals for transmission between two adjacent ultra-high frequency UHF broadcast channels comprises a signal generator for generating a plurality of local oscillator LO signals, and a plurality of mixers each arranged to mix one of the LO signals with one of a plurality of input signals to generate one of the RF subcarrier signals, said input signal including information to be transmitted by said RF subcarrier signal. Variable gain amplifiers can be provided to independently amplify the RF subcarrier signals before they are combined. The LO signals can have the same frequency and the input signals can have different frequencies, or the LO signals can have different frequencies and the input signals can have the same frequency. A second LO signal with a different frequency to a first LO signal can be obtained by dividing a reference frequency by a predetermined value and mixing with the first LO signal. Methods of generating a plurality of RF subcarrier signals are also disclosed.

14 Claims, 10 Drawing Sheets

(56) References Cited

OTHER PUBLICATIONS

Communication dated May 8, 2012, issued by the Intellectual Property Office of the United Kingdom in counterpart GB application No. 1200195.4.

Communication, dated Jan. 16, 2013, issued by the European Patent Office in counterpart European Application No. 12186171.0.

Jongsik Kim et al: "A 54 862-MHz CMOS Transceiver for TV-Band White-Space Device Applications", IEEE Transactions on Microwave Theory and Techniques, IEEE Service Center, Piscataway, NJ, US, vol. 59, No. 4, Apr. 1, 2011, pp. 966-977.

* cited by examiner

APPARATUS GENERATING SUBCARRIER FOR TRANSMISSION BETWEEN ULTRA-HIGH FREQUENCY CHANNELS AND METHOD GENERATING OF THE SAME

CROSS-REFERENCE TO RELATED APPLICATION

This application claims priority from U.S. Application No. 61/542,964, filed on Oct. 4, 2011 in the USPTO and from British Patent Application No. 1200195.4, filed on Jan. 6, 2012 in the British Intellectual Property Office, the disclosures of which are herein incorporated by reference.

BACKGROUND

1. Field

The present invention relates to generating subcarrier signals for transmission in a frequency range between adjacent ultra-high frequency (UHF) channels. More particularly, the present invention relates to generating radio-frequency subcarrier signals by mixing input signals with local oscillator signals, each input signal including information to be transmitted by one of the RF subcarrier signals.

2. Description of the Related Art

In the field of wireless communications, the availability of bandwidth within the frequency spectrum becomes more restricted as more wireless technologies and services are introduced. To cope with the increasingly crowded spectrum, in recent years there has been interest in releasing previously reserved bandwidth between existing channels. In television (TV) broadcasting, this is referred to as TV White Space (TVWS).

It would be preferred if multiple services could be provided in the space between two channels, in order to maximise the usage of the available bandwidth. However, when subcarriers are used to provide a plurality of services in the narrow bandwidth between existing channels, the frequencies used for the subcarriers have to be accurately controlled to ensure that they do not interfere with the closely adjacent channels. Accordingly, there is a need to efficiently and cost-effectively generate subcarriers at well-defined frequencies for transmission in the TVWS between existing channels.

SUMMARY

According to the present invention, there is provided apparatus arranged to generate a plurality of radio-frequency RF subcarrier signals for transmission in a frequency range between two adjacent ultra-high frequency UHF broadcast channels, the apparatus comprising a signal generator arranged to generate a plurality of local oscillator LO signals based on a reference frequency, and a plurality of mixers each arranged to mix one of the LO signals with one of a plurality of input signals to generate one of the RF subcarrier signals, said input signal including information to be transmitted by said RF subcarrier signal.

The plurality of LO signals can be arranged to have the same frequency as each other and the plurality of input signals can be arranged to have different frequencies from each other, such that the plurality of RF subcarrier signals are generated at different frequencies in said frequency range.

The signal generator may comprise a plurality of signal generation modules each arranged to receive the reference frequency and generate one of the plurality of LO signals at a different frequency, wherein the plurality of input signals can be arranged to have the same frequency as each other.

Each signal generator module may comprise a voltage-controlled oscillator VCO and a phase-locked loop PLL.

The plurality of signal generator modules may include a first signal generator module arranged to receive the reference frequency and generate a first one of the LO signals, and a second signal generator module arranged to receive the reference frequency and the first LO signal, divide the reference frequency by a predetermined value to generate a frequency offset signal, and mix the frequency offset signal with the first LO signal to generate a second one of the LO signals at a different frequency to the first LO signal.

The predetermined value may be obtained based on:

$$N = \text{Ref}/\Delta f$$

where N is the predetermined value, Ref is the reference frequency, and $\Delta f$ is a target frequency offset between the first and second LO signals.

N may be rounded to an integer value, and may be rounded up to the nearest integer.

The apparatus may further comprise a plurality of variable gain amplifiers each arranged to amplify one of the plurality of RF subcarrier signals, wherein the plurality of variable gain amplifiers can be arranged to be independently controlled such that the same gain or a different gain can be applied to each one of the plurality of RF subcarrier signals.

The apparatus may further comprise a signal combiner arranged to combine the plurality of RF subcarrier signals into a combined carrier signal for transmission.

The apparatus may further comprise an amplification module for amplifying the combined carrier signal.

According to the present invention, there is further provided a method of generating a plurality of radio-frequency RF subcarrier signals for transmission in a frequency range between two adjacent ultra-high frequency UHF broadcast channels, the method comprising generating a plurality of local oscillator LO signals based on a reference frequency, and generating each one of the RF subcarrier signals by mixing one of the LO signals with one of a plurality of input signals, said input signal including information to be transmitted by said RF subcarrier signal.

The plurality of LO signals may have the same frequency as each other and the plurality of input signals may each have a different frequency, such that the plurality of RF subcarrier signals are generated at different frequencies in said frequency range.

The plurality of LO signals can each have a different frequency, and the plurality of input signals can have the same frequency as each other.

A second one of the LO signals can be generated by dividing the reference frequency by a predetermined value to generate a frequency offset signal, and mixing the frequency offset signal with a first one of the LO signals to generate the second LO signal at a different frequency to the first LO signal.

The predetermined value may be obtained based on:

$$N = \text{Ref}/\Delta f$$

where N is the predetermined value, Ref is the reference frequency, and $\Delta f$ is a target frequency offset between the first and second LO signals.

N may be rounded to an integer value, and may be rounded up to the nearest integer.

The method may further comprise amplifying each one of the plurality of RF subcarrier signals, by applying the same gain or a different gain to each one of the plurality of RF subcarrier signals.

The method may further comprise combining the plurality of RF subcarrier signals into a combined carrier signal for transmission.

BRIEF DESCRIPTION OF THE DRAWINGS

Embodiments of the present invention will now be described, by way of example only, with reference to the accompanying drawings, in which.

DETAILED DESCRIPTION

Figure 1:
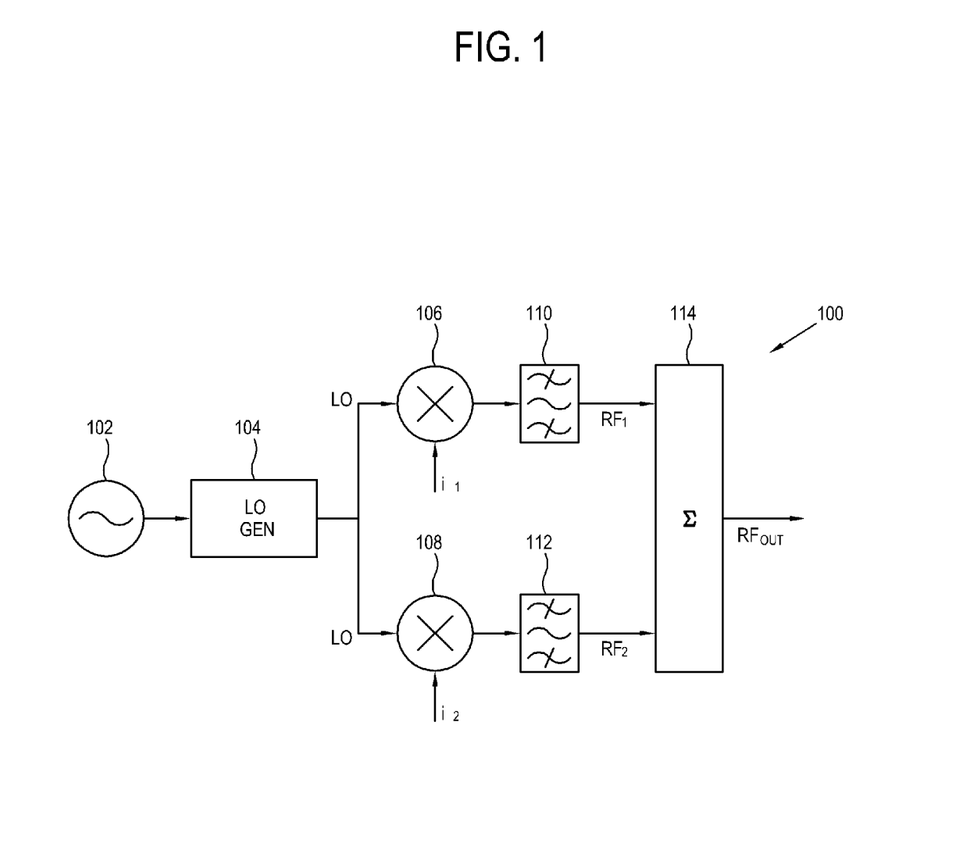
FIG. 1 illustrates an apparatus for generating RF subcarrier signals for transmission between adjacent UHF broadcast channels, according to an embodiment of the present invention.

Referring now to FIG. 1, an apparatus 100 for generating RF subcarrier signals for transmission between adjacent UHF broadcast channels is illustrated, according to an embodiment of the present invention. For example, the apparatus 100 could be used to generate subcarriers for transmitting a video streaming service and a music/audio service. However the present invention is not limited to these examples and other services could be transmitted as required.

As shown in FIG. 1, the apparatus 100 comprises a reference frequency source 102, a signal generator 104 connected to the reference frequency source 102, first and second mixers 106, 108 connected to the signal generator 104, first and second bandpass filters 110, 112 each connected to one of the mixers 106, 108, and a signal combiner 114 connected to the bandpass filters 110, 112.

In the present embodiment, the reference frequency source 102 is a temperature-compensated crystal oscillator TCXO, although in other embodiments other sources, for example other types of crystal oscillator, may be used. The reference frequency source 102 generates a signal having a predetermined frequency, which is used as a reference frequency by the signal generator 104 to generate a local oscillator signal LO. In the present embodiment, the signal generator 104 comprises a voltage-controlled oscillator VCO and phase-locked loop PLL arranged to output the LO signal having a predetermined frequency difference to the reference frequency. The use of a PLL-VCO combination can allow the LO frequency to be adjusted during use, for example to generate subcarriers at different frequencies without having to change the reference frequency generated by the TCXO. Similarly, if the reference frequency drifts over time, for example due to temperature drift of the TCXO crystal, the PLL-VCO can still maintain the LO signal at a constant frequency. However, in other embodiments other means for generating the LO signal may be used. In general, the signal generator 104 can be arranged to generate the LO signal having the same frequency as the reference frequency, or a different frequency.

The LO signal is sent to both mixers 106, 108, each of which is also arranged to receive a baseband signal $i_1$, $i_2$ at an intermediate frequency IF. The two baseband signals $i_1$, $i_2$ are generated so that they are different in frequency. Therefore when the baseband signals $i_1$, $i_2$ are mixed with the same LO signal, radio-frequency RF subcarrier signals $RF_1$, $RF_2$ are produced at different frequencies. Each RF subcarrier $RF_1$, $RF_2$ is then filtered by one of the bandpass filters 110, 112 to remove unwanted mixing products that would cause interference if transmitted. That is, the bandwidth of each bandpass filter is chosen to correspond to the desired bandwidth of the RF subcarrier being filtered. The RF subcarrier signals are frequency-shifted versions of the input baseband signals $i_1$, $i_2$. For instance, if the first baseband signal $i_1$ is generated at a first intermediate frequency X MHz, and the LO signal has a frequency Y MHz, the output of the first mixer 106 will include signals at X±Y MHz. The first filter 110 is arranged to remove the unwanted product at X−Y MHz, such that the frequency of the filtered RF signal $RF_1$ is X+Y MHz. Alternatively, the mixing product X−Y MHz can be used for the RF subcarrier signal, in which case the first filter 110 can be arranged to remove the unwanted product at X+Y MHz. As such, a desired frequency offset between the generated subcarrier signals can be obtained by using a suitable frequency offset between the baseband signals $i_1$, $i_2$. Finally, the filtered RF subcarriers $RF_1$, $RF_2$ are combined in the signal combiner 114 to produce a combined carrier signal $RF_{OUT}$ to be transmitted in the frequency band between adjacent UHF channels.

Although in the embodiment of FIG. 1, two subcarrier signals are generated, in other embodiments any number of subcarriers may be generated by including additional mixers as required and generating additional baseband input signals at appropriate frequency offsets to each other. The baseband signals can be generated using conventional methods, for example digital data can be converted to analogue form by modulating a sinusoidal signal. In general, a baseband signal can be either I (in-phase) or Q (quadrature phase), or can be both I and Q combined. For example, a vector modulator can be used to provide both I and Q.

Also, although in the embodiment of FIG. 1 the same LO signal is mixed with baseband signals at different frequencies, the present invention is not limited to this arrangement. In other embodiments, different LO signals can be mixed with baseband signals of the same frequency as each other to produce subcarrier signals at predetermined frequency offsets.

Figure 2:
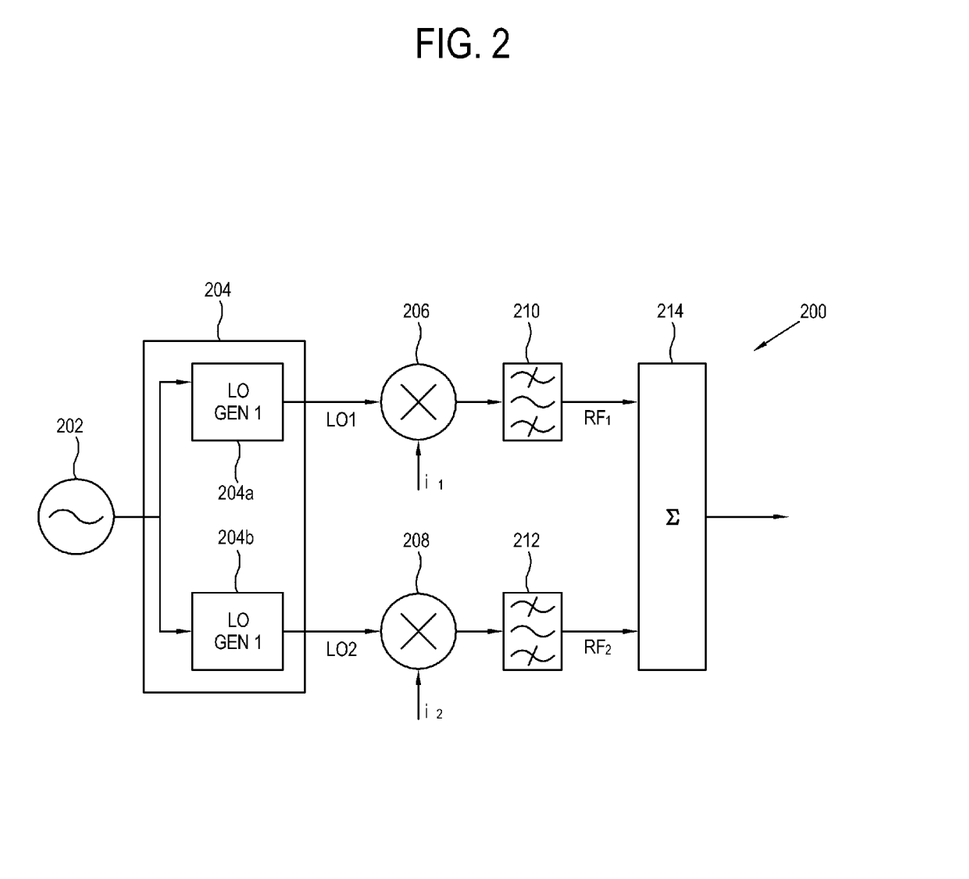
FIG. 2 illustrates an apparatus for generating RF subcarrier signals for transmission between adjacent UHF broadcast channels according to an embodiment of the present invention.

Referring now to FIG. 2, an apparatus 200 for generating RF subcarrier signals for transmission between adjacent UHF broadcast channels is illustrated, according to another embodiment of the present invention. Like the embodiment of FIG. 1, in the present embodiment the apparatus comprises a reference frequency source TCXO 202, a signal generator 204 connected to the TCXO 202, first and second mixers 206, 208 connected to the signal generator 204, first and second bandpass filters 210, 212 connected to the mixers 206, 208, and a signal combiner 214 connected to the bandpass filters 210, 212. To maintain brevity, only those features of the present embodiment which differ from the embodiment of FIG. 1 will now be described.

As shown in FIG. 2, in the present embodiment the signal generator 204 comprises a first LO generating module 204a and a second LO generating module 204b. Here, the LO generating modules 204a, 204b each comprise a VCO and PLL similar to the signal generator 104 of FIG. 1, except that in the present embodiment the LO generating modules 204a, 204b are arranged to generate LO signals LO1, LO2 at different frequencies to one another. This means that the frequency separation between the RF subcarrier signals $RF_1$, $RF_2$ can be controlled by varying the frequency offset between the LO signals LO1, LO2. In comparison to the solution of FIG. 1, this can relieve some of the processing required when generating the baseband signals $i_1$, $i_2$ since they can be generated at the same frequency.

As with FIG. 1, embodiments similar to the one shown in FIG. 2 are not limited to only generating two subcarrier signals. In general, any number of signal generating modules may be provided for generating the required number of LO signals, and additional mixers can be provided for mixing the LO signals with baseband signals of the same frequency as each other to generate the RF subcarrier signals.

Figure 3:
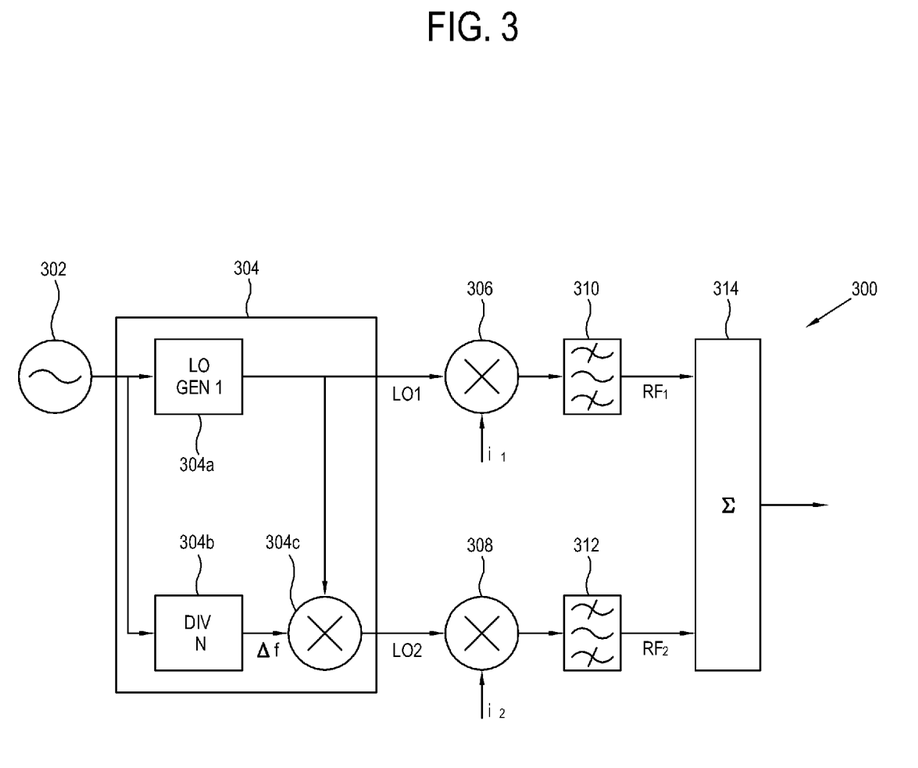
FIG. 3 illustrates an apparatus for generating RF subcarrier signals for transmission between adjacent UHF channels, according to an embodiment of the present invention.

Referring now to FIG. 3, an apparatus 300 for generating RF subcarrier signals for transmission between adjacent UHF channels is illustrated, according to a further embodiment of the present invention. Like the embodiments of FIGS. 1 and 2, in the present embodiment the apparatus 300 comprises a reference frequency source TCXO 302, a signal generator 304 connected to the TCXO 302, first and second mixers 306, 308 connected to the signal generator 304, first and second bandpass filters 310, 312 connected to the mixers 306, 308, and a signal combiner 314 connected to the bandpass filters 310, 312. To maintain brevity, only those features of the present embodiment which differ from the embodiments of FIGS. 1 and 2 will now be described.

As shown in FIG. 3, in the present embodiment the signal generator 304 comprises a first signal generating module 304a, and a second signal generating module comprising a counter 304b and mixer 304c. The first signal generating module 304a is a VCO and PLL combination similar to those described in relation to the previous embodiments, arranged to generate a first LO signal LO1. However, unlike the previous embodiments, a second LO signal LO2 is generated by applying a frequency offset Δf to the first LO signal LO1. Here, the frequency offset is obtained by a counter 304b arranged to count a number of cycles N of the reference frequency received from the TCXO. The output of the counter 304b therefore corresponds to a signal having a frequency Δf given by:

$$\Delta f = \text{Ref}/N,$$

where N is the number of cycles counted and Ref is the reference frequency generated by the TCXO.

As described above, the frequency offset signal is generated by using a counter to divide the reference frequency. In some embodiments however, other means for generating the frequency offset signal can be used. For instance, the frequency offset signal could be generated by another PLL, or by using another crystal oscillator to supply the required frequency. In the present embodiment the use of a counter and mixer combination is preferred, as this arrangement offers lower power consumption and lower cost than these alternative solutions.

The frequency offset signal Δf is then mixed with the first LO signal LO1 in the mixer 304c of the second signal generating module, to offset the first LO signal LO1 by the frequency offset Δf. The output of the mixer 304c is used as the second LO signal LO2, and input to the second mixer 308 for mixing with the second baseband signal $i_2$.

In the present embodiment, as in the embodiment of FIG. 2, LO signals can be generated at different frequencies, thus allowing the baseband signals $i_1$, $i_2$ to be generated at the same frequency as each other. Furthermore, in the present embodiment, the generation of additional LO signals after the first LO signal is done using counter and mixer combinations. These components are cheaper than the additional VCOs and PLLs required in FIG. 2, and accordingly the present embodiment offers a more cost-effective solution for generating a plurality of RF subcarriers.

As an example, if the apparatus of FIG. 3 is required to generate subcarrier signals with a frequency offset of 2 Megahertz (MHz), based on a reference frequency of 26 MHz produced by the TCXO 302, the counter 304b is arranged to divide the reference frequency by 13, i.e. N=13. This produces a frequency offset signal Δf of 26/13=2 MHz. Accordingly, when mixed with the first LO signal LO1, this gives a second LO signal LO2 having a frequency 2 MHz higher than the LO1 frequency. Therefore when the first and second LO signals LO1, LO2 are mixed respectively with first and second baseband input signal $i_1$, $i_2$ having the same frequency, the resulting RF subcarriers will also have a 2 MHz frequency offset.

As with FIGS. 1 and 2, embodiments similar to the one shown in FIG. 3 are not limited to only generating two subcarrier signals. An example of how the concept of FIG. 3 may be extended to generate an arbitrary number of subcarriers will now be explained with reference to FIG. 4.

Figure 4:
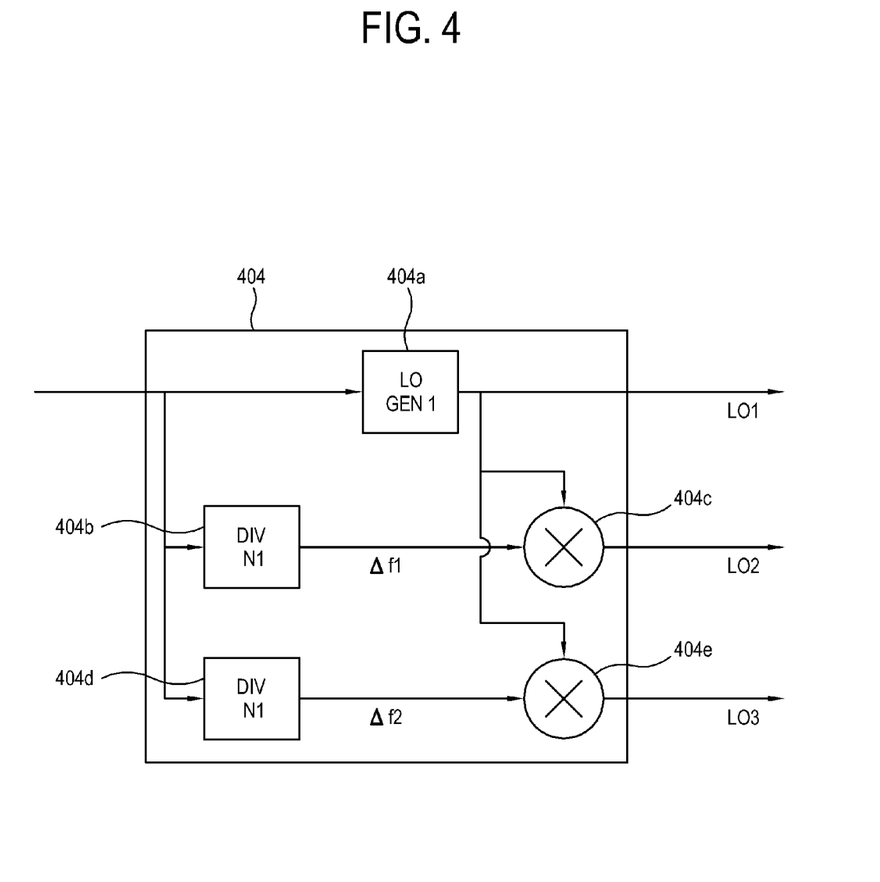
FIG. 4 illustrates a signal generator for generating a plurality of LO signals, according to an embodiment of the present invention.

Referring now to FIG. 4, a signal generator 404 for generating a plurality of LO signals is illustrated, according to an embodiment of the present invention. The signal generator may be suitable for use in apparatus 300 such as that shown in FIG. 3 when more than two LO signals are required, i.e. when more than two subcarriers are to be generated.

Like the signal generator 304 of FIG. 3, the signal generator 404 of the present embodiment comprises a first signal generating module 404a comprising a VCO and PLL for generating a first LO signal LO1, and a second signal generating module comprising a counter 404b and mixer 404c. The second signal generating module operates in a similar manner to the second signal generating module of FIG. 3, to generate the second LO signal LO2. In addition, the signal generator 404 comprises a third signal generating module similar to the second signal generating module, comprising another counter 404d and mixer 404e.

As shown in FIG. 4, the counter 404b of the second signal generating module is arranged to divide the reference frequency by a number N1, to produce a first frequency offset signal Δf1 to be mixed with the first LO signal LO1. The counter 404d of the third signal generating module is arranged to divide the reference frequency by a different number N2, to produce a second frequency offset signal Δf2 having a different frequency to the first frequency offset signal Δf1. The second frequency offset signal Δf2 is mixed with the first LO signal LO1 to produce the third LO signal LO3, which will be different in frequency to the other two LO signals LO1, LO2. In particular, the frequency difference between the first and second LO signals LO1, LO2 will be Δf1, and the frequency different between the second and third LO signals LO2, LO3 will be Δf2−Δf1.

As an example, the signal generator 404 of FIG. 4 may be used in an apparatus similar to the one shown in FIG. 3, but arranged to generate three RF subcarriers based on three input baseband signals. If the reference frequency generated by the TCXO is 26 MHz and a 2 MHz offset is required between each subcarrier, the first counter 404b can be arranged to divide the reference frequency by 13 to give a first frequency offset signal Δf1 of 26/13=2 MHz. Similarly, the second counter 404d can be arranged to divide the reference frequency by 6.5 to give a second frequency offset signal Δf2 of 26/6.5=4 MHz, such that the difference between the second and third LO signals LO2, LO3, given by Δf2−Δf1, is also 2 MHz.

Although in the above-described example the second counter 404d is arranged to divide the reference frequency by 6.5, to minimise complexity and cost it is preferable that each counter is arranged to divide the reference frequency by an integer value. Therefore if a non-integer value is obtained using the formula N=Ref/Δf, the value of N can be rounded up or down to the nearest integer. Preferably, the value of N is rounded up to ensure that the resulting frequency offset is at least greater than the desired frequency offset, to avoid a subcarrier being generated at too high a frequency and interfering with an adjacent UHF channel. Therefore if a value of 6.5 is obtained for N, as described above, the second counter 404d may instead be arranged to divide the reference frequency by 7, resulting in a frequency difference between the second and third LO signals LO2, LO3 of 26/7=3.71 MHz. If a counter of 6 were used instead, a frequency difference of 26/6=4.33 MHz would be obtained. Depending on the particular frequencies used this may be enough to shift the subcarrier too close to the adjacent channel when a frequency offset of 4 MHz was intended, hence rounding up may be preferred.

In general, to generate any given number n of LO signals, a total of n−1 counter/mixer combinations such as the ones shown in FIG. 4 may be provided. Each counter can be arranged to divide the reference frequency by a suitable number to give the desired frequency differences between the LO signals.

Figure 5:
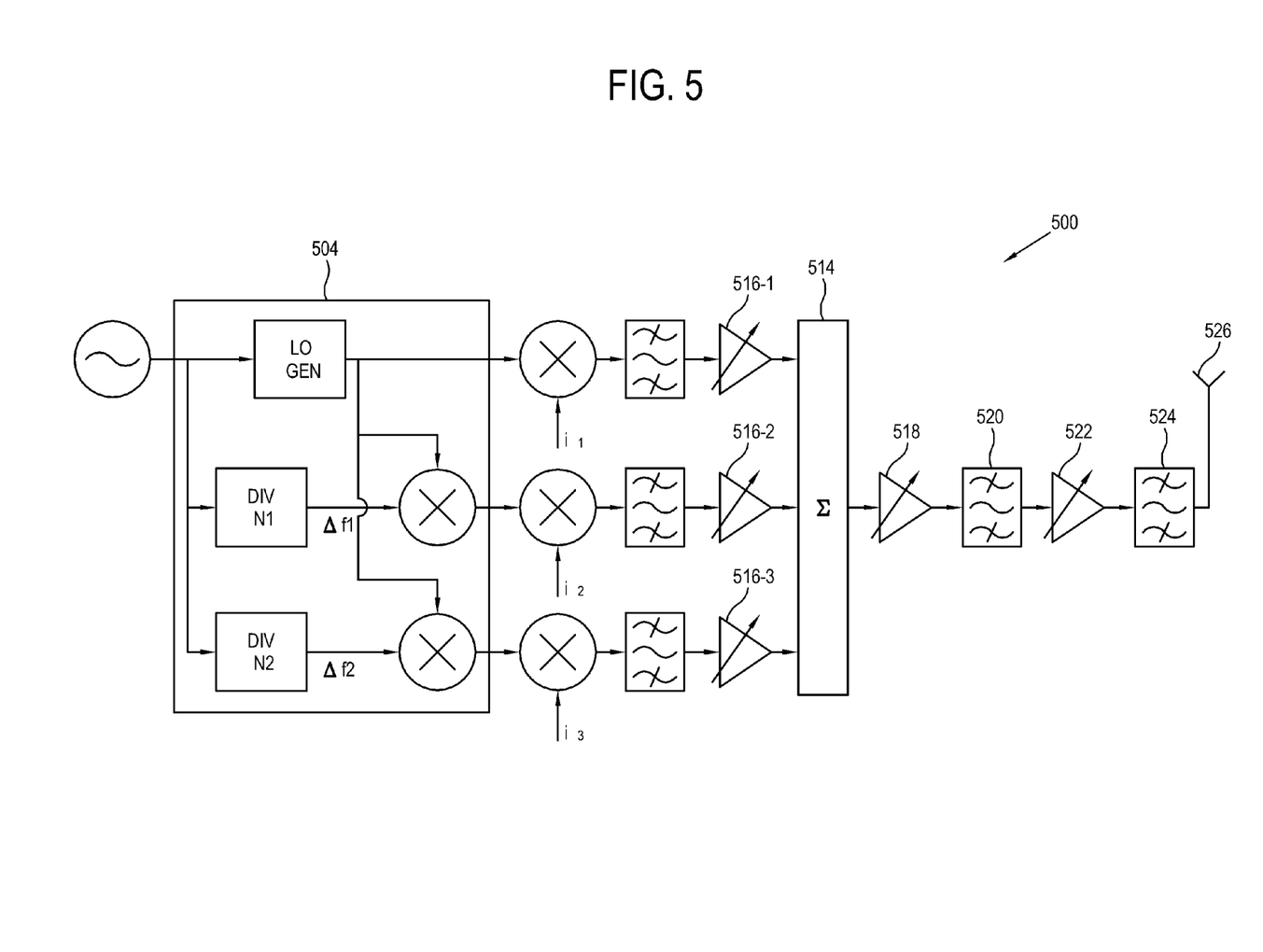
FIG. 5 illustrates an apparatus for generating a plurality of subcarriers with different power levels.

Referring now to FIG. 5, an apparatus 500 for generating a plurality of subcarriers with different power levels is illustrated, according to an embodiment of the present invention. The apparatus 500 comprises a TCXO for generating a reference frequency, a signal generator 504 similar to the one of FIG. 4 for generating three LO signals, a plurality of mixers and filters for producing filtered RF subcarrier signals by combining the LO signals with input baseband signals $i_1$, $i_2$, $i_3$, and a signal combiner 514 to combine the RF subcarrier signals for transmission. Since these components function in a similar manner to those of the previously-described embodiments, a detailed description is omitted to maintain brevity.

Additionally, the apparatus 500 comprises first, second and third variable-gain amplifiers (VGAs) 516-1, 516-2, 516-3 each arranged to amplify one of the filtered RF subcarriers before the subcarriers are combined. The VGAs can be independently controlled in order to apply different gains to the different subcarriers. This feature may be particularly useful in scenarios where the service provided by a particular subcarrier is required to cover a larger geographic area than the services provided by other subcarriers. The appropriate subcarrier can therefore be amplified using a higher gain so that the subcarrier can be received over a larger area, while to minimise power consumption and interference between subcarriers the other subcarriers are only amplified using a lower gain.

Also, as shown in FIG. 5, the apparatus 500 further comprises an output stage for amplifying and filtering the combined carrier signal before transmission. The output stage comprises an output VGA 518, a bandpass filter 520 to filter the combined carrier and remove unwanted noise amplified by the output VGA 518, a power amplifier 522 to amplify the combined carrier to the desired transmission power, a low-pass filter 524 to remove high-frequency noise from the amplified output signal, and an antenna 526 for transmitting the combined carrier. The bandwidth of the output bandpass filter 520 can be set to correspond to the total bandwidth covered by the combined carrier signal, such that any amplified noise which would otherwise interfere with adjacent channels if the full TVWS is utilised is removed.

A similar output stage may be employed for amplifying and transmitting the combined carrier signals produced by any of the embodiments of FIGS. 1 to 4, and in some embodiments certain components of the output stage may be omitted depending on the particular signal purity requirements for a given application, for example the output VGA 518 and bandpass filter 520 could be omitted.

Furthermore, although in FIG. 5 a plurality of VGAs 516-1, 516-2, 516-3 are provided before the combiner 514 to independently amplify the subcarriers as required, in other embodiments some or all of these may be omitted. For example, in another embodiment similar to the one shown in FIG. 5, these pre-combiner VGAs 516-1, 516-2, 516-3 are omitted, and the output VGA is used to apply the same gain to all subcarriers. Also, in some embodiments similar to those of FIGS. 1 to 4, pre-combiner VGAs can additionally be included to independently amplify these subcarrier signals before combining.

Embodiments of the present invention have been described in which the frequency offset between subcarrier signals can be accurately controlled to prevent subcarriers from interfering with one another, or with an adjacent UHF channel. Examples of subcarrier signals that can be generated by embodiments of the present invention will now be described with reference to FIGS. 6 to 9.

Figure 6:
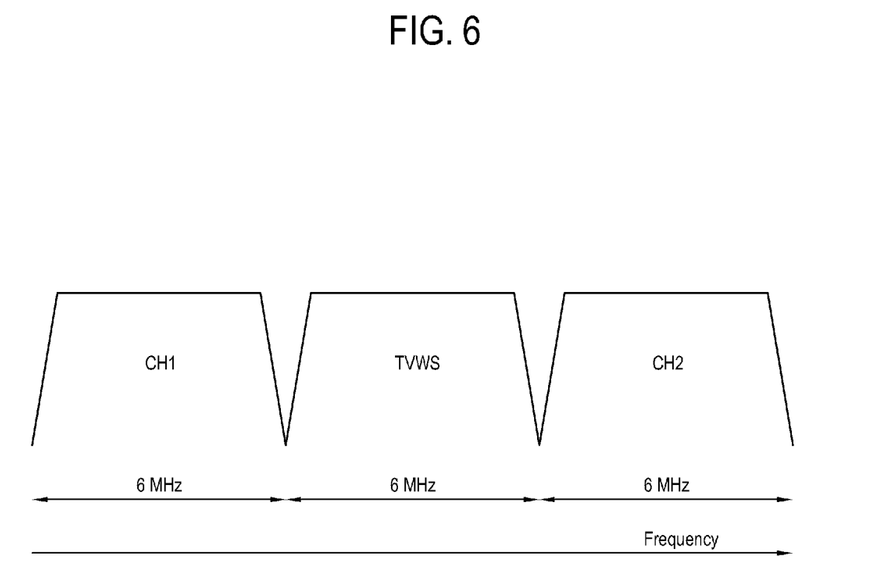
FIG. 6 illustrates TV white space between adjacent UHF channels.

Referring now to FIG. 6, a band of TVWS between adjacent UHF channels is illustrated. In this example, two UHF channels CH1, CH2 are illustrated. Each UHF channel CH1, CH2 has a bandwidth of 6 MHz, and the channels are separated by TVWS of 6 MHz. The skilled person will understand that these bandwidths are merely exemplary. The present invention is not limited to the particular bandwidths shown in FIG. 6, and in other embodiments the specific frequencies and bandwidths may be varied as appropriate. For example, the available white space between adjacent channels may vary between territories, depending on how the electromagnetic spectrum is regulated in each territory.

Figure 7:
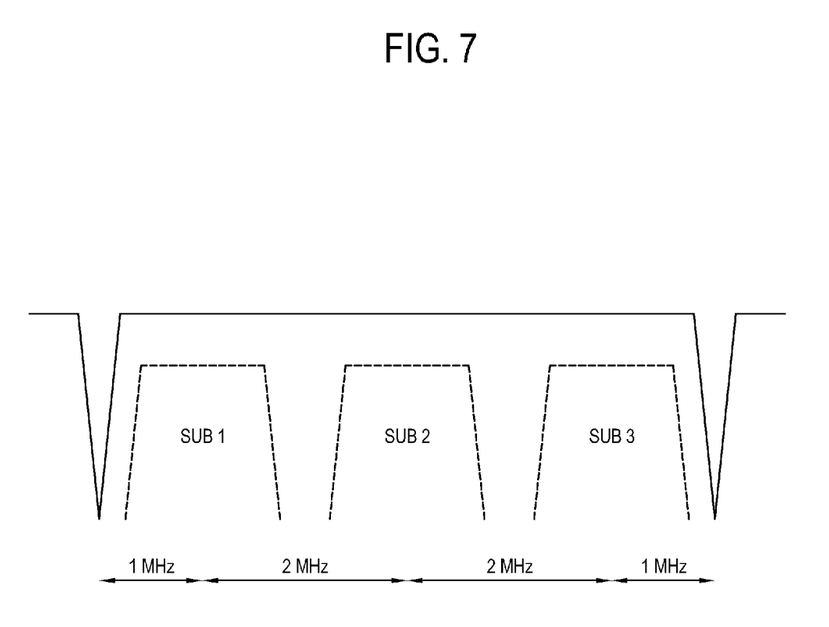
FIG. 7 illustrates three subcarrier signals for transmission in the TVWS of FIG. 6, according to an embodiment of the present invention.

Referring now to FIG. 7, three RF subcarriers for transmission in the TVWS of FIG. 6 are illustrated, according to an embodiment of the present invention. In the present embodiment, the spectrum is shared equally between the three subcarriers SUB1, SUB2, SUB3. That is, the three subcarriers SUB1, SUB2, SUB3 are each of equal width. Also, the frequency offset between centre frequencies of adjacent subcarriers is 2 MHz, and in the available TVWS bandwidth of 6 MHz, this means that the centre frequency of each outermost subcarrier lies 1 MHz from the adjacent channel. In the present embodiment, the subcarriers are generated to have a bandwidth of 0.5 MHz each, ensuring that they do not interfere with one another or with the adjacent channels. In other embodiments however, other bandwidths for the subcarriers may be used. In general, for any of the above-described embodiments the bandwidth of any given subcarrier can be controlled by controlling the bandwidth of the baseband signal from which that subcarrier is generated.

Figure 8:
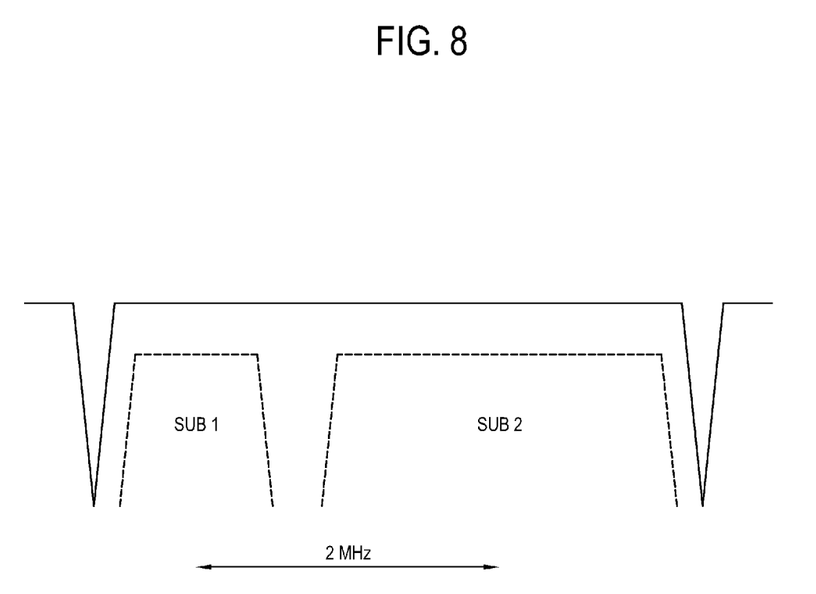
FIG. 8 illustrates asymmetric subcarriers for transmission in the TVWS of FIG. 6, according to an embodiment of the present invention.

Referring now to FIG. 8, asymmetric subcarriers for transmission in the TVWS of FIG. 6 are illustrated, according to an embodiment of the present invention. In this embodiment, the centre frequencies of first and second subcarriers SUB1, SUB2 are separated in frequency by 2 MHz, and the second subcarrier SUB2 has a larger bandwidth than the first subcarrier. As mentioned above, subcarriers with different bandwidths can be generated by providing input baseband signals of different bandwidths. In the present embodiment, the first subcarrier SUB1 has a bandwidth of 1 MHz, and the second subcarrier SUB2 has a bandwidth of 2 MHz. This may be useful, for example, when the second subcarrier SUB2 is required for a video streaming service demanding a high data rate, while the first subcarrier SUB1 is required for a service requiring a lower data rate, such as an audio or text-based service.

By allowing subcarriers to be generated with any required bandwidths and at any frequency offsets relative to one another, embodiments of the present invention can therefore maximise the extent to which the available TVWS is utilised.

Figure 9:
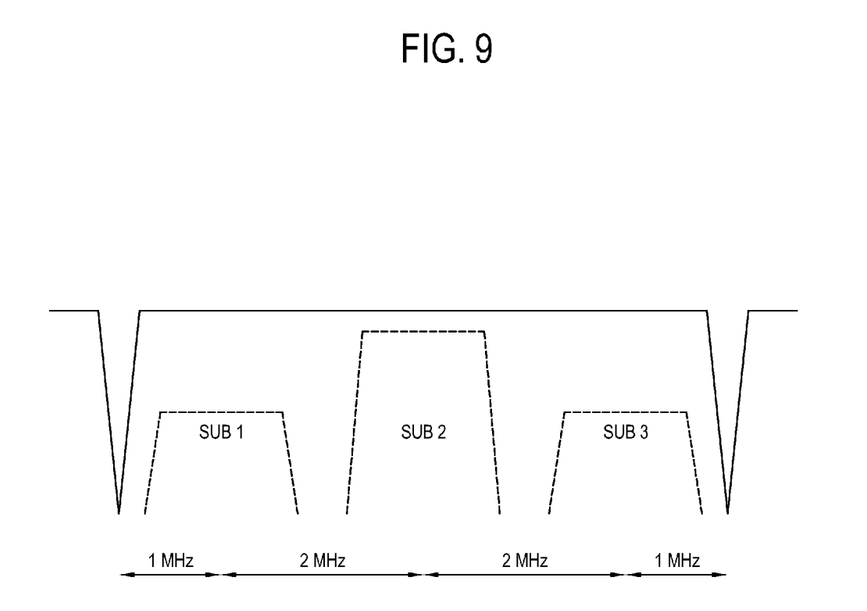
FIG. 9 illustrates subcarrier signals with different power levels for transmission in the TVWS of FIG. 6, according to an embodiment of the present invention.

Referring now to FIG. 9, subcarrier signals with different power levels for transmission in the TVWS of FIG. 6 are illustrated according to an embodiment of the present invention. As described above, VGAs before the signal combiner can be used to amplify each subcarrier using a different gain, for example as shown in FIG. 5. In the present embodiment, three subcarriers SUB1, SUB2, SUB3 similar to the subcarriers of FIG. 7 are illustrated, separated by 2 MHz frequency offsets. However, unlike FIG. 7, in the present embodiment the first and third subcarriers SUB1, SUB3 have a lower power level than the second subcarrier SUB2. As described above, this can be useful when one of the subcarriers, in this case the second subcarrier SUB2, is providing a service that is required to cover a larger geographical area than services provided by other subcarriers.

Figure 10:
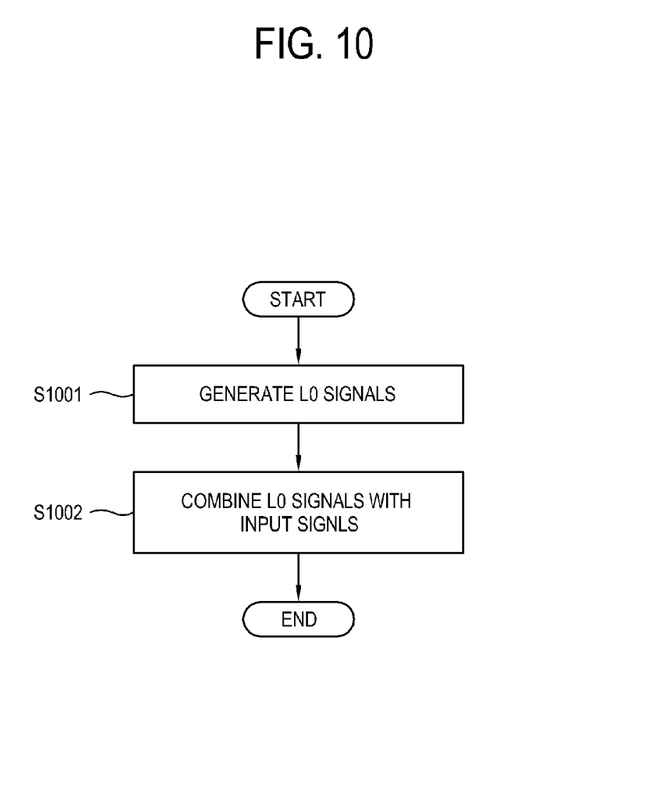
FIG. 10 illustrates a method of generating a plurality of RF subcarrier signals for transmission between adjacent UHF broadcast channels, according to an embodiment of the present invention.

Referring now to FIG. 10, a method of generating an RF subcarrier signal for transmission between adjacent UHF channels is illustrated, according to an embodiment of the present invention. The method could be performed by analogue components arranged to provide the necessary functionality, or by digital components such as a field-programmable gate array (FPGA), application-specific integrated circuit (ASIC), or a processor executing a computer program for performing the method.

Firstly, in step S1001 a plurality of local oscillator LO signals are generated based on an input frequency. The LO signal can be generated using any of the approaches used in FIGS. 1 to 5, i.e. the plurality of LO signals can have the same frequency as each other (cf. FIG. 1) or can have different frequencies (cf. FIGS. 2 to 5).

Then, in step S1002 each LO signal is mixed with one of the baseband input signal to generate each one of the RF subcarrier signals.

In some embodiments of the method, the RF subcarrier signal is filtered to remove unwanted mixing products. Additionally, the RF subcarrier signals may be filtered and/or amplified and can be combined into a combined carrier signal, and the combined carrier may also be filtered and/or amplified before transmission as shown in FIG. 5.

Embodiments of the present invention have been described which can generate a plurality of RF subcarriers for providing different services in the TVWS between adjacent UHF broadcast channels. Since each RF subcarrier signal is generated by mixing an input, e.g. baseband, signal with an LO signal, the frequency of the RF subcarrier signal can be easily changed if required. That is, the apparatus according to embodiments of the present invention may be controllable to change the frequency of one of the RF subcarrier signals by changing a frequency of the LO signal and/or the input signal used to generate said one of the RF subcarrier signals. As an example, in the apparatus of FIG. 1, an input signal generator can be controllable to independently change the frequency of each input signal. The input signal generator may be included in the apparatus or the input signals may be generated externally. In embodiments such as those of FIGS. 2 to 5, the frequencies of any LO signal may be independently changed by controlling the components used to generate the particular LO signal, for example a VCO-PLL signal generator can be controlled to vary the frequency of the generated LO signal. In embodiments which use a counter and mixer to generate additional LO signals (cf. FIGS. 3 to 5), the predetermined value of the counter may be adjusted during use to change the frequency offset applied to any given LO signal.

Although embodiments of the present invention have been described in which bandpass filters are used to filter RF subcarrier signals before combining the signals, in other embodiments the filtering could be applied after combining instead of before combining, for example using a multi-band filter. Alternatively, in some embodiments the filtering may be omitted altogether, for example if a subcarrier has a relatively low signal power and the power levels of any unwanted mixing products are sufficiently low as to not interfere with other signals being transmitted.

Furthermore, although embodiments of the present invention have been described in which a single reference frequency is used when generating a plurality of LO signals, for example as shown in FIGS. 2 to 5, in other embodiments additional reference frequencies may be provided. For instance, in the embodiment of FIG. 2 the second signal generating module 204$b$ could receive a different reference frequency from a second reference frequency source, instead of receiving the same reference frequency as the first signal generating module 204$a$. The reference frequencies could be arranged to have a predetermined frequency difference in order to produce the desired frequency offset between subcarriers.

Additionally, whilst embodiments of the present invention have been described in which baseband signals are mixed with local oscillator signals to generate subcarrier signals, the present invention is not restricted to use with baseband signals. In general, an input signal input to a mixer for mixing with a LO signal may have any intermediate frequency, i.e. any frequency below the RF/carrier frequency. The frequency of the input signal and/or the frequency of the LO signal input to any given mixer can be controlled such that the RF subcarrier signal generated by the mixer has a frequency (or frequencies) lying in the frequency range between the adjacent UHF broadcast channels.

Embodiments of the present invention have been described with reference to FIGS. 1 to 5 in which a plurality of RF subcarrier signals are generated, but in some embodiments of the present invention only a single subcarrier may be generated. For example, if a high data rate is required, only a single subcarrier can be used so that the service provided by the subcarrier can utilise the full bandwidth available in the TVWS between the adjacent UHF channels.

Whilst certain embodiments of the present invention have been described above, the skilled person will understand that many variations and modifications are possible without departing from the scope of the invention as defined in the accompanying claims. Any features of any described embodiment may be used in combination with any features of any other described embodiment.

What is claimed is:

1. Apparatus arranged to generate a plurality of radio-frequency RF subcarrier signals for transmission in a frequency range between two adjacent ultra-high frequency UHF broadcast channels, the apparatus comprising:
   a signal generator arranged to generate a plurality of local oscillator LO signals based on a reference frequency; and
   a plurality of mixers each arranged to mix one of the LO signals with one of a plurality of input signals to generate one of the RF subcarrier signals, said input signal including information to be transmitted by said RF subcarrier signal,
   wherein the signal generator comprises a plurality of signal generation modules each arranged to receive the reference frequency and generate one of the plurality of LO signals at a different frequency,
   wherein the plurality of input signals are arranged to have the same frequency as each other, and
   wherein the plurality of signal generator modules includes:
      a first signal generator module arranged to receive the reference frequency and generate a first one of the LO signals; and
      a second signal generator module arranged to receive the reference frequency and the first LO signal, divide the reference frequency by a predetermined value to generate a frequency offset signal, and mix the frequency offset signal with the first LO signal to generate a second one of the LO signals at a different frequency to the first LO signal.

2. The apparatus according to claim 1, wherein each signal generator module comprises a voltage-controlled oscillator VCO and a phase-locked loop PLL.

3. The apparatus according to claim 1, wherein the predetermined value is obtained based on:

$$N = \text{Ref}/\Delta f$$

where N is the predetermined value, Ref is the reference frequency, and $\Delta f$ is a target frequency offset between the first and second LO signals.

4. The apparatus according to claim 3, wherein N is rounded to an integer value.

5. The apparatus according to claim 3, wherein N is rounded up to the nearest integer.

6. The apparatus according to claim 1, further comprising:
   a plurality of variable gain amplifiers each arranged to amplify one of the plurality of RF subcarrier signals,
   wherein the plurality of variable gain amplifiers are arranged to be independently controlled such that the same gain or a different gain can be applied to each one of the plurality of RF subcarrier signals.

7. The apparatus according to claim 1, further comprising:
   a signal combiner arranged to combine the plurality of RF subcarrier signals into a combined carrier signal for transmission.

8. The apparatus according to claim 7, further comprising:
   an amplification module for amplifying the combined carrier signal.

9. A method of generating a plurality of radio-frequency RF subcarrier signals for transmission in a frequency range between two adjacent ultra-high frequency UHF broadcast channels, the method comprising:
   generating a plurality of local oscillator LO signals based on a reference frequency; and
   generating each one of the RF subcarrier signals by mixing one of the LO signals with one of a plurality of input signals, said input signal including information to be transmitted by said RF subcarrier signal,
   wherein the plurality of LO signals each have a different frequency, and the plurality of input signals have the same frequency as each other, and
   wherein a second one of the LO signals is generated by dividing the reference frequency by a predetermined value to generate a frequency offset signal, and mixing the frequency offset signal with a first one of the LO signals to generate the second LO signal at a different frequency to the first LO signal.

10. The method according to claim 9, wherein the predetermined value is obtained based on:

$$N = \text{Ref}/\Delta f$$

where N is the predetermined value, Ref is the reference frequency, and $\Delta f$ is a target frequency offset between the first and second LO signals.

11. The method according to claim 10, wherein N is rounded to an integer value.

12. The method according to claim 10, wherein N is rounded up to the nearest integer.

13. The method according to claim 9, further comprising:
   amplifying each one of the plurality of RF subcarrier signals, by applying the same gain or a different gain to each one of the plurality of RF subcarrier signals.

14. The method according to claim 9, further comprising:
   combining the plurality of RF subcarrier signals into a combined carrier signal for transmission.

* * * * *